United States Patent

Nienhuis

[15] 3,643,139

[45] Feb. 15, 1972

[54] INTEGRATED CIRCUIT HAVING FOUR MOSFET DEVICES ARRANGED IN A CIRCLE SURROUNDING A GUARD DIFFUSION

[72] Inventor: Rijkent Jan Nienhuis, Nijmegen, Netherlands

[73] Assignee: U.S. Philips Corporation, New York, N.Y.

[22] Filed: Oct. 29, 1969

[21] Appl. No.: 872,192

[30] Foreign Application Priority Data

Nov. 2, 1968 Netherlands..........................6815661

[52] U.S. Cl........................317/235 R, 307/304, 317/235 B, 317/235 G, 317/235 AG

[51] Int. Cl.......................................H01l 19/00, H01l 11/14

[58] Field of Search..........................317/235, 235 G, 235 B; 307/304

[56] References Cited

UNITED STATES PATENTS

| | | | |
|---|---|---|---|
| 3,378,688 | 4/1968 | Kabell | 250/211 |
| 3,440,502 | 4/1969 | Lin et al. | 317/235 |
| 3,517,175 | 6/1970 | Williams | 307/221 C X |

OTHER PUBLICATIONS

Electronics, Vol. 38 (Sept.–Oct. 1965) p. 155, "Mosfet for analog switching"

*Primary Examiner*—John W. Huckert
*Assistant Examiner*—William D. Larkins
*Attorney*—Frank R. Trifari

[57] ABSTRACT

A semiconductor device having four insulated gate field effect transistors uses each transistor electrode zone as a common electrode zone for adjacent transistors. The transistors are arranged around a channel stopper and are surrounded by a second channel stopper. The compact structure of the semiconductor device optimizes the use of a substrate area without leakage between electrode zones.

4 Claims, 3 Drawing Figures

PATENTED FEB 15 1972 3,643,139

SHEET 1 OF 2

Figure 1:
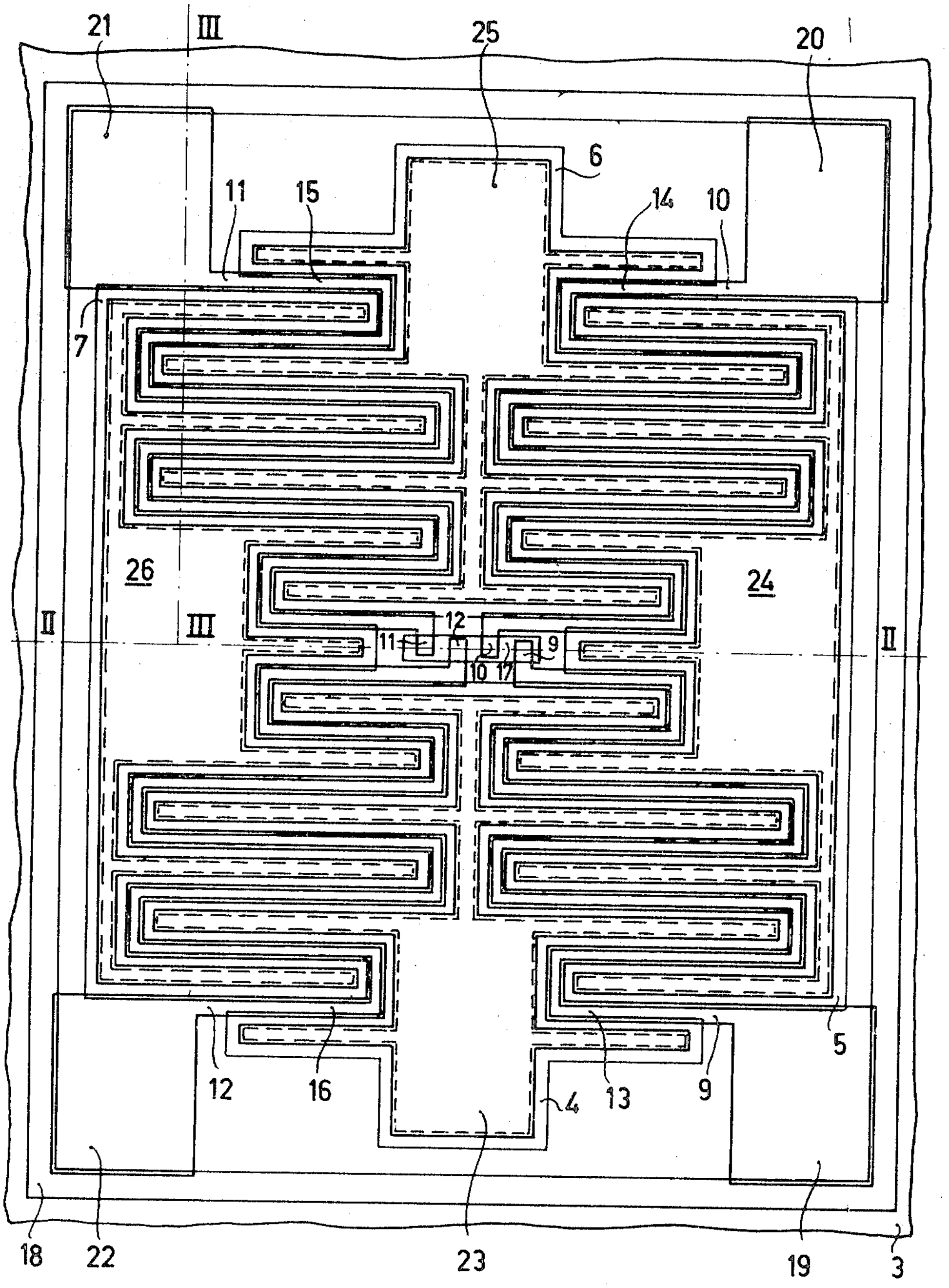

INVENTOR.
RIJKENT J. NIENHUIS
BY
AGENT

INVENTOR.
RIJKENT J. NIENHUIS
BY
AGENT

INTEGRATED CIRCUIT HAVING FOUR MOSFET DEVICES ARRANGED IN A CIRCLE SURROUNDING A GUARD DIFFUSION

The invention relates to a semiconductor device comprising a semiconductor body having a region of one conductivity type adjoining a substantially flat surface—hereinafter termed substrate—in which a number of spaced electrode zones of the opposite conductivity type extend from the surface, said electrode zones being associated with the source and drain electrodes of at least three successive field effect transistors with insulated gate electrodes arranged in a row, a drain electrode of a transistor of the row also forming the source electrode of the subsequent transistor of the row, an insulating layer on which a pattern of conductive tracks extends which comprises the insulated gate electrodes of the transistors being situated on the said surface, channel regions adjoining the said surface being situated below the gate electrodes each of the said channel regions extending between the two electrode zones of a transistor of the row.

From circuit technology, various circuits are known in which a number of field effect transistors are arranged in a ring. Such circuits are used, for example, as ring modulators, as choppers or as ring counters.

It is the object of the invention to provide such a circuit in an integrated form in which the field effect transistors are realized as a compact assembly, while the circuit nevertheless shows a good quality. The invention is based inter alia on the recognition of the fact that this can be achieved by arranging the field effect transistors around a channel stopper and surrounding said transistors in addition collectively, by a second channel stopper.

According to the invention, a semiconductor device of the type mentioned in the preamble is characterized in that the electrode zones are situated around a central first channel stopper, the drain electrode of the last transistor of the row also forming the source electrode of the first transistor of the row, the electrode zones being surrounded at the surface by a second channel stopper, the channel regions each extending from the first to the second channel stopper, and the gate electrodes each extending to above said two channel stoppers.

In this manner a compact structure is obtained which is possible only owing to the presence of the two channel stoppers. By these channel stoppers it is prevented that leakage currents can flow between the electrode zones in addition to the current controlled by the gate electrode. In spite of their small mutual distance, the electrode zones are isolated from each other in a simple manner, so that the available area is used effectively.

The channel regions and the gate electrodes preferably have the form of a zigzag-shaped assembly, as a result of which channel regions with a large width can be obtained without the transistors requiring a considerably larger area.

The channel stoppers can be obtained in various manners. As is known, certain properties of the insulating layer, for example, the number of surface states and the charge concentration in the insulating layer, play an important part upon the channel information or inversion at the semiconductor surface. It is known per se that channel stoppers can be obtained by locally influencing the properties of the insulating layer. For example, an insulating layer of silicon dioxide which is provided locally by thermal oxidation and for the rest by depositing from the vapor phase, the latter treatment being carried out at a much lower temperature. The remaining part may then serve as a channel stopper. Furthermore a silicon dioxide layer may be covered, for example, locally with silicon nitride, and the desirable difference in properties can be obtained by a suitable after-treatment at a comparatively low temperature. The part of the insulating layer covered with silicon nitride may form a channel stopper.

The channel stoppers, however, are preferably surface regions of the same conductivity type as the substrate, and these regions extend from the surface in the substrate and have a larger impurity concentration than the substrate.

Such channel stoppers can be obtained very simply and diffusion and, the quality is not dependent upon the said critical properties of the insulating layer which is of advantage inter alia owing to the larger freedom in the choice of the sequence of the various treatments during manufacture.

A ring circuit of field effect transistors with insulated gate electrodes may be used inter alia in a mixer as is described, for example, in 1968 International Solid-State Circuits Conference, Digest of Technical papers, pages 122 and 123. This MOSFET mixer comprises four field effect transistors.

An important embodiment of the semiconductor device according to the invention is characterized in that the row comprises four transistors in which the second channel stopper encloses a rectangle, the first channel stopper being situated in the center of said rectangle and each of the gate electrodes extending from a corner of the rectangle to above the first channel stopper, the electrode zones and the gate electrodes showing contact pads, the contact pads of the gate electrodes being situated in the corners of the rectangle and extending partly above the second channel stopper, the contact pads of the electrode zones being situated within the rectangle and in the immediate proximity of the centers of the sides of each of the respective rectangle.

With this compact structure, the available surface is particularly effectively used. In this connection, it is to be noted that a semiconductor crystal with an integrated circuit usually has a rectangular shape and often is even square. It will be obvious that with the structure as described the largest possible part of such a rectangular or square crystal can be occupied by the integrated circuit.

The contact pads of the gate electrodes will usually extend only for a small part of their surface above the second channel stopper, because the capacitance between the gate electrodes and the substrate per unit of surface is larger for those parts of the gate electrodes which are situated above the higher doped channel stoppers than for the remaining parts. Furthermore, in connection with the same capacitance it may be advantageous to use an insulating layer which has a larger thickness below the contact pads than below the remaining part of the gate electrode.

Figure 2:
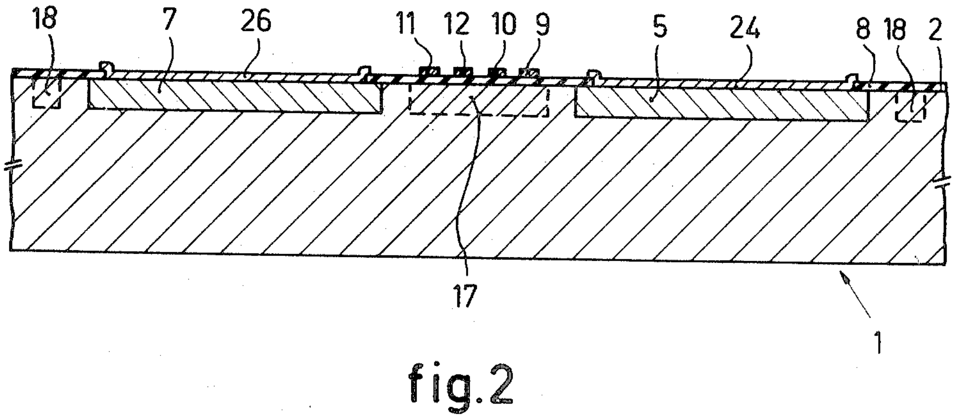
Figure 3:
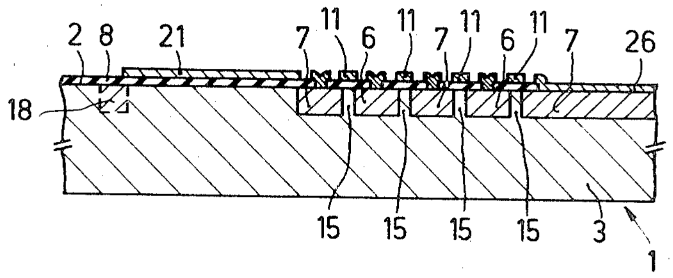

In order that the invention may be readily carried into effect, it will now be described in greater detail, by way of example, with reference to the accompanying drawings, in which, FIG. 1 is a diagrammatic plan view of a semiconductor device according to the invention, while FIG. 2 is a diagrammatic cross-sectional view taken on the line II—II of FIG. 1, and FIG. 3 is a diagrammatic cross-sectional view taken on the line III—III of FIG. 1.

The semiconductor device shown in FIGS. 1, 2 and 3 comprises a semiconductor body having a region 3 of one conductivity type which forms a substrate adjoining a substantially flat surface 2. In the substrate 3 a number of electrode zones 4 to 7 situated at a distance from each other extend from the surface 2 and are associated with the source and drain electrodes of a number of successive insulated gate field effect transistors connected in a row, the drain electrode of one transistor of the also forming the source electrode of the subsequent transistor of the row. An insulating layer 8 (which in FIG. 1 is assumed to be transparent so that the underlying regions are visible) is situated on the surface 2 and a pattern of conductive tracks is situated on said layer which pattern comprises the insulated gate electrodes 9 to 12. Below these gate electrodes, channel regions 13 to 16 extend and adjoin the surface 2.

According to the invention, the electrode zones 4 to 7 are situated around a central channel stopper 17, the drain electrode of the last transistor of the row also forming the source electrode of the first transistor of the row, so that the transistors are arranged in a ring, while the electrode zones 4 to 7 are furthermore surrounded at the surface 2 by a second channel stopper 18.

The integrated circuit shown in FIGS. 1 to 3 hence comprises a ring of four field effect transistors. In addition to four gate electrodes 9 to 12, the semiconductor device comprises four electrode zones 4 to 7, each of the electrode zones being common for two transistors of the ring.

By using the channel stoppers 17 and 18, the result is achieved that the transistors can be arranged at a small mutual distance, because the occurrence of uncontrolled leakage currents between the electrode zones is made substantially impossible by the channel stoppers. As a result of this a compact structure of the integrated circuit is made possible without reduction in quality of the transistors as a result of the small mutual distance occuring.

The gate electrodes 9 to 12 and the channel regions 13 to 16 are zigzag-shaped, so that the width of the channel regions is large in relation to the width of the gate electrode regions. The zigzag channel regions are situated between the electrode zones 4 to 7, which latter form an interdigital pattern.

The channel stoppers 17 and 18 are surface regions which extend from the surface 2 in the substrate 3.

These channel stoppers 17 and 18 are of the same conductivity type as the substrate 3, but show a larger impurity concentration so that inversion at the surface of said region is avoided.

It is to be noted that in practice the circuit described is usually manufactured in a large number simultaneously in the same semiconductor slice, after which such a slice is subdivided into smaller units. As a result of this subdivision a semiconductor crystal with an integrated circuit usually is rectangular and preferably even square. In the present example, the semiconductor body 3 is rectangular. In connection with this shape it is of importance that the channel stopper 18 also has a rectangular construction. The channel stopper 17 is situated in the center of the rectangular channel stopper 18.

The gate electrodes 9 to 12 are provided with contact pads 19 to 22. The electrode zones 4 to 7 contact, through windows in the insulating layer 8, contact layers 23 to 26, in which contact pads are formed by local widenings of the contact layers.

The gate electrodes 9 to 12 extend from the corners of the rectangle enclosed by the channel stopper 18 to above the central channel stopper 17, the contact pads 19 to 22 being situated in the corners of the rectangle and partly above the channel stopper 18. The local widenings of the contact layers 23 to 26 of the electrode zones 4 to 7 are situated within the rectangle and in the immediate proximity of the center of the sides thereof.

With this structure the largest possible part of the area of the substrate 3 can be used effectively. In connection with the capacitance between the gate electrodes and the substrate, it is desirable that the gate electrodes extend only for a small part of their surface above the channel stopper, because the part situated above the higher doped channel stopper supplies a comparatively large contribution to said capacitance. For the same reason it may be desirable to give the insulating layer 8 below the contact pads 19 to 22 a larger thickness than below the gate electrodes 9 to 12.

The semiconductor device described can be manufactured entirely in the manner conventionally used in semiconductor technology. Starting material may be an *n*-type silicon body having a resistivity of 4 ohm. cm. On this body a silicon dioxide layer is provided in, the conventional manner in which windows can be provided with conventional photoresist methods for diffusion of the electrode zones 4 to 7. These electrode zones are, for example, boron-doped and have for example, a sheet resistance of approximately 125 ohm. and extend, for example, to a depth of approximately 2.5 $\mu$m. in the substrate 3. During or after the diffusion treatment the diffusion windows are closed by thermal oxidation. Diffusion windows for the channel stoppers 17 and 18 can then be provided in the insulating layer in conventional manners. As a dope for these surface regions may be used, for example, phosphorus in which the sheet resistance of the diffused layer may be, for example, approximately 20 ohm./□. After this diffusion treatment the insulating layer can be removed in which part of said layer may be maintained, if desirable, at places where eventually an insulating layer with a larger thickness is desirable. A new insulating layer may then be provided all over the surface, for example, likewise by thermal oxidation. In this new insulating layer which may have a thickness of, for example, approximately 0.2 $\mu$m. Contact windows for the electrode zones are provided while afterwards, for example, by vapor depositing, a conductive layer of, for example, aluminum, can be provided. For this conductive layer a pattern of conductive tracks can be obtained in the conventional manner by etching, which pattern comprises the gate electrodes 9 to 12 with contact pads 9 to 22, as well as the contact layers 22 to 26 of the electrode regions.

Finally the semiconductor crystal 3 can be provided in normal manner in a conventional envelope, in which the contact pads can be connected to the pins of such an envelope via conductors.

It will be obvious that the invention is not restricted to the example described and that many variations are possible to those skilled in the art without departing from the scope of this invention. For example, instead of an *n*-type substrate, a *p*-type substrate may be used in which the conductivity types of the regions may be changed also. Furthermore, a ring circuit according to the invention may also form part of an integrated circuit which comprises other circuit elements. The gate electrodes and the electrode zones may then be connected to the remaining part of the circuit via conductive tracks situated on the insulating layer, in which it is not necessary for the gate electrodes and the electrode zones to be provided with contact pads while the substrates 3 may be an insulated island. Furthermore, the substrate 3, may be formed by an epitaxial layer or a part thereof, in which said epitaxial layer may be provided on a base of the same or the opposite conductivity type. Other semiconductor materials, for example, germanium or $A_{III}B_V$ compounds, may also be used. The insulating layer may consist, for example, of silicon nitride or another suitable insulating material. The conductive tracks may consist of a conductor differing from aluminum, for example, molybdenum, which may be coated with, for example, a layer of gold.

I claim:

1. A semiconductor device comprising a semiconductor body having a region of one conductivity type adjoining a substantially flat surface, at least three spaced electrode zones of the opposite conductivity type in said body and adjoining said surface, said electrode zones being associated with the electrodes of at least three adjacent insulated gate field effect transistors arranged in a row and each having source and drain electrodes defining a surface channel region, each of said electrode zones being common to electrodes for two of said transistors which are adjacent to each other, means to electrically contact each of said electrode zones, an insulating layer on said surface, a pattern of conductor tracks on said insulating layer forming separate gate electrodes over said surface channel regions for each of said transistors, a first channel stopper centrally located whereby said electrode zones are situated around said first channel stopper, and a second channel stopper surrounding said electrode zones, each of said channel regions extending from said first to said second channel stoppers and each of said gate electrodes extending at least to above said first and second channel stoppers.

2. A semiconductor device as claimed in claim 1 wherein the channel regions and the gate electrodes are zigzag-shaped.

3. A semiconductor device as claimed in claim 1 wherein the channel stoppers are surface regions of the one conductivity type which extend from the surface and which have a larger impurity concentration than the surface.

4. A semiconductor device as claimed in claim 2, wherein the row comprises four transistors, in which the second channel stopper encloses a rectangle, the first channel stopper being situated in the center of the rectangle and each of the gate electrodes extending from the corners of the rectangle to above the first channel stopper, the electrode zone and the gate electrodes comprising contact pads, the contact pads of the gate electrodes being situated in the corners of the rectangle and partly extending above the second channel stopper, the contact pads of the electrode zones being situated within the rectangle and in the immediate proximity of the center each of the respective sides of the rectangle.

* * * * *